United States Patent [19]
Guenther, Jr. et al.

[11] Patent Number: 6,124,717
[45] Date of Patent: Sep. 26, 2000

[54] LOW FREQUENCY SUPPRESSION CIRCUIT FOR A TIME DOMAIN REFLECTOMETER

[75] Inventors: Edgar T. Guenther, Jr., Bend; Ronald J. Larrick, Redmond, both of Oreg.

[73] Assignee: Tektronix, Inc., Beaverton, Oreg.

[21] Appl. No.: 09/032,435

[22] Filed: Feb. 27, 1998

[51] Int. Cl.[7] .................................................. G01R 27/04
[52] U.S. Cl. .......................... 324/642; 324/644; 324/534
[58] Field of Search .................................... 324/532, 533, 324/534, 535, 642, 643, 644

[56] References Cited

U.S. PATENT DOCUMENTS 5,117,123 5/1992 Sendelweek ............................ 307/259
5,726,578 3/1998 Hook ...................................... 324/643

*Primary Examiner*—Josie Ballato
*Assistant Examiner*—Jose M. Solis
*Attorney, Agent, or Firm*—William K. Bucher

[57] ABSTRACT

An improved time domain reflectometer (TDR) includes a capacitor coupled in series between a transmission medium under test and the TDR receiver input. A switch, operating under microprocessor control, selectively couples and uncouples the capacitor to a voltage reference, such as ground. During the generation of interrogating pulses from the TDR and the acquisition of data from the transmission medium under test, the capacitor is uncoupled from the voltage reference and acts as a DC blocking capacitor. During periods of non-TDR activity, the capacitor is coupled to voltage reference and acts as a load for low frequency interference appearing on the transmission medium. The capacitor-switch operation blocks low frequency interference signals from the receiver input of the TDR.

7 Claims, 4 Drawing Sheets

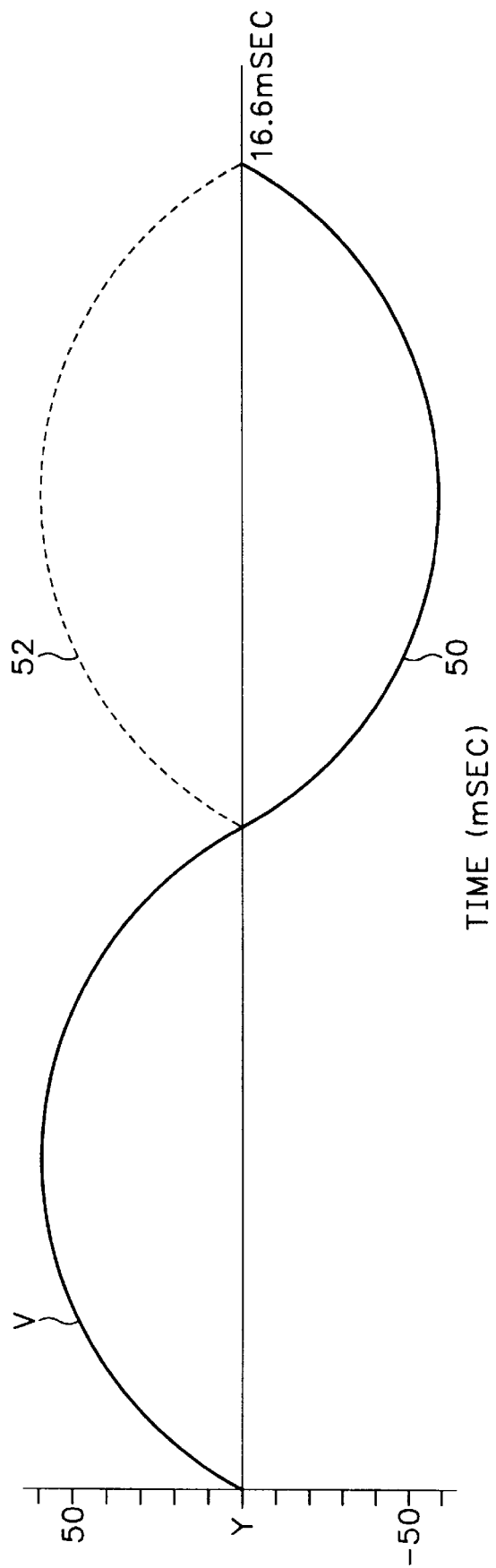

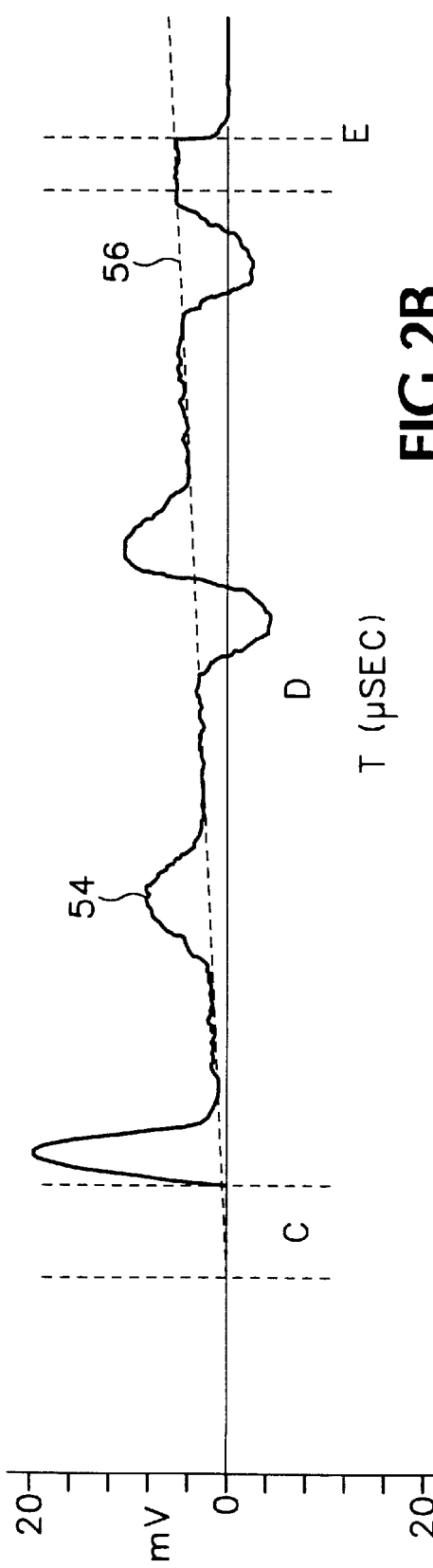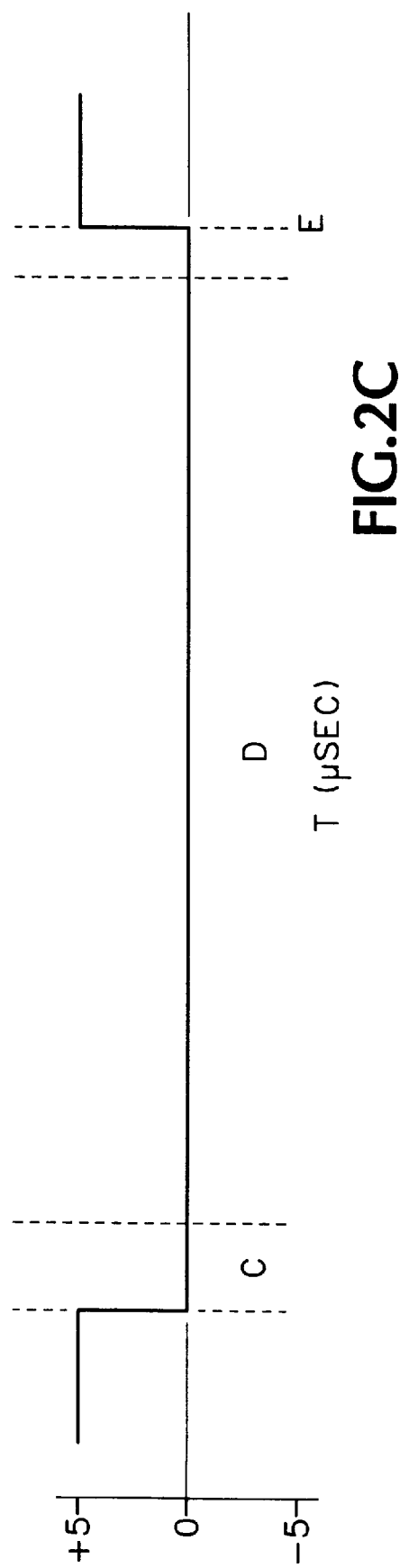

LOW FREQUENCY SUPPRESSION CIRCUIT FOR A TIME DOMAIN REFLECTOMETER

BACKGROUND OF THE INVENTION

The present invention relates generally to measurement test instruments for characterizing a transmission medium and more particularly to an improved time domain reflectometer having a low frequency suppression circuit for removing such things as power line influences from time domain reflectometry data.

A time domain reflectometer (TDR) launches interrogating energy pulses from a pulse generator into a transmission medium, such as shielded and unshielded twisted pairs, coaxial cables, and the like, at a given pulse repetition rate, depending upon the designated range of the TDR. During the periods between pulses, acquisition circuitry in a receiver samples the cable to acquire data representative of reflections from flaws, discontinuities, or breaks in the cable. The reflections in the cable are timed from the time of transmission of the energy pulse to determine the range from the transmitter to such flaws, discontinuities, or breaks. Reflections may represent changes in wire gauge, splices, moisture in the cable, and the like. The acquired data is processed and displayed as a waveform trace on a display device, such as a cathode-ray-tube, a liquid crystal display, or the like.

A TDR notes any changes in the characteristic impedance of the cable under test. For a telecommunications copper facility or plant, the characteristic impedance is typically between 100 and 125 ohms. Most unshielded cables fall between 100 and 105 ohms. Shielded cable like T1 is typically about 125 ohms. Any change in the cable's impedance is displayed on the TDR display device as an upward bump, downward dip, or some combination of both deviating from a horizontal trace. The TS100 and the TV110 Time Domain Reflectometers, manufactured and sold by Tektronix, Inc., Wilsonville, Oreg. and assignee of the instant invention, are examples of TDRs for respectively characterizing telephone twisted pair cables and coaxial cable, such as in CATV and the like.

Low frequency signals may be present on the transmission line during cable characterization. A low frequency signal that affects twisted pair cables is a 120 volts, 60 Hz signal induced from adjacent power lines. In coaxial cables cable TV transmission systems, a 120 volts, 60 Hz signal may be applied to the cable conductor of trunk lines for providing power to trunk amplifiers. Existing time domain reflectometers use a high pass filter connected to the input of the receiver circuitry for suppressing these low frequency signals on the transmission medium under test. One example of such a high pass filter, used in the TS100 Time Domain Reflectometer, is a 330 pF capacitor connected to a 10 Ω resistor. The use of such a high pass filter does not adversely affect the characterization results for shorter cable lengths where the pulsewidth of the interrogating pulses are in nanoseconds. However for longer cable lengths where the pulsewidth is, for example, 3 microseconds the use of the high pass filter does affect the characterization results. The minimum bandwidth requirement for recovering information from a 3 microsecond pulse is in the 300 kHz range. In order to attenuate a 120 volt, 60 Hz signal to a range of about 10 millivolts for characterizing small return reflections requires a high pass filter having a bandpass in the 600 kHz range. Therefore, using a high pass filter for characterizing long cable lengths results in a loss of information.

In the television industry, a DC restorer clamping circuit is used to DC restore or maintain a reference at a predetermined level. Any induced 60 Hz modulation is removed by clamping at each horizontal line interval. The damper is an electronic switch which is usually closed by the occurrence of a horizontal sync pulse, momentarily grounding the signal to earth ground or some fixed DC voltage. The time selected for closure is either the sync tip or the blanking level just after the sync tip.

The operation of this circuit is synchronous with the incoming television signal.

What is needed is a time domain reflectometer that suppresses low frequency signals, such as power line influences, from the receiver of the TDR without limiting the bandwidth of the instrument.

SUMMARY OF THE INVENTION

Accordingly, an object of the present invention is to suppress undesirable low frequency signals from the input receiver of a time domain reflectometer.

Another object of the present invention is a provide a wide bandwidth input to a time domain reflectometer that is maintained within the linear range of the receiver.

A further object of the present invention is to provide a low frequency suppression circuit having a switch with low resistance and capacitance for wide bandwidth TDR operation.

Accordingly, the present invention is to an improved time domain reflectometer having a pulse generator for launching interrogating pulses into a transmission medium under test, a receiver for acquiring data representative of return reflections from the transmission medium, and interface for coupling the pulse generator and receiver to the transmission medium, and a controller for controlling the operation of the time domain reflectometer. The improvement is a low frequency suppression circuit having a capacitor coupled in series between the interface and the receiver and a switch having one terminal coupled to a voltage reference and the other terminal coupled between the capacitor and the receiver and responsive to inputs from the controller for selectively disconnecting the capacitor from the voltage reference during the launching of interrogating pulses and acquisition of data by the receiver.

The capacitor in the low frequency suppression circuit has a value sufficient for providing a long time constant to the high input impedance receiver. In the preferred embodiment of the present invention, the capacitor has a value in the range of about 0.01 microfarad to 0.1 microfarad. The resistance of the switch is minimized to provide maximum attenuation of the low frequency noise when the switch is on. The capacitance of the switch is minimized to avoid attenuating high frequency signal when the switch is off. In the preferred embodiment of the present invention the switch is a field effect transistor having low resistance and capacitance, such as a small channel, low capacitance DMOS field effect transistor having a resistance in the range of seven ohms and a capacitance in the range of two to three picofarads. Alternately, the switch may be a relay.

One terminal of the switch is coupled to a voltage reference for biasing the receiver midway in the sampling range of an analog-to digital converter in the receiver.

In the preferred embodiment of the present invention, the voltage reference is instrument ground. The objects, advantages and novel features of the present invention are apparent from the following detailed description when read in conjunction with the appended claims and attached drawings.

BRIEF DESCRIPTION OF THE DRAWINGS

FIG. 2A is a representative waveform trace of low frequency interference signals on a transmission cable under test associated with the improved time domain reflectometer incorporating the low frequency suppression circuit according to the present invention.

FIG. 2B is a representative waveform drawing of the return signal from a transmission cable under test showing the effects of the low frequency suppression circuit according to the present invention.

FIG. 2C is a representative waveform drawing of the switch drive signal from the controller in the low frequency suppression circuit according to the present invention.

DETAILED DESCRIPTION OF THE PREFERRED EMBODIMENT

Figure 1:
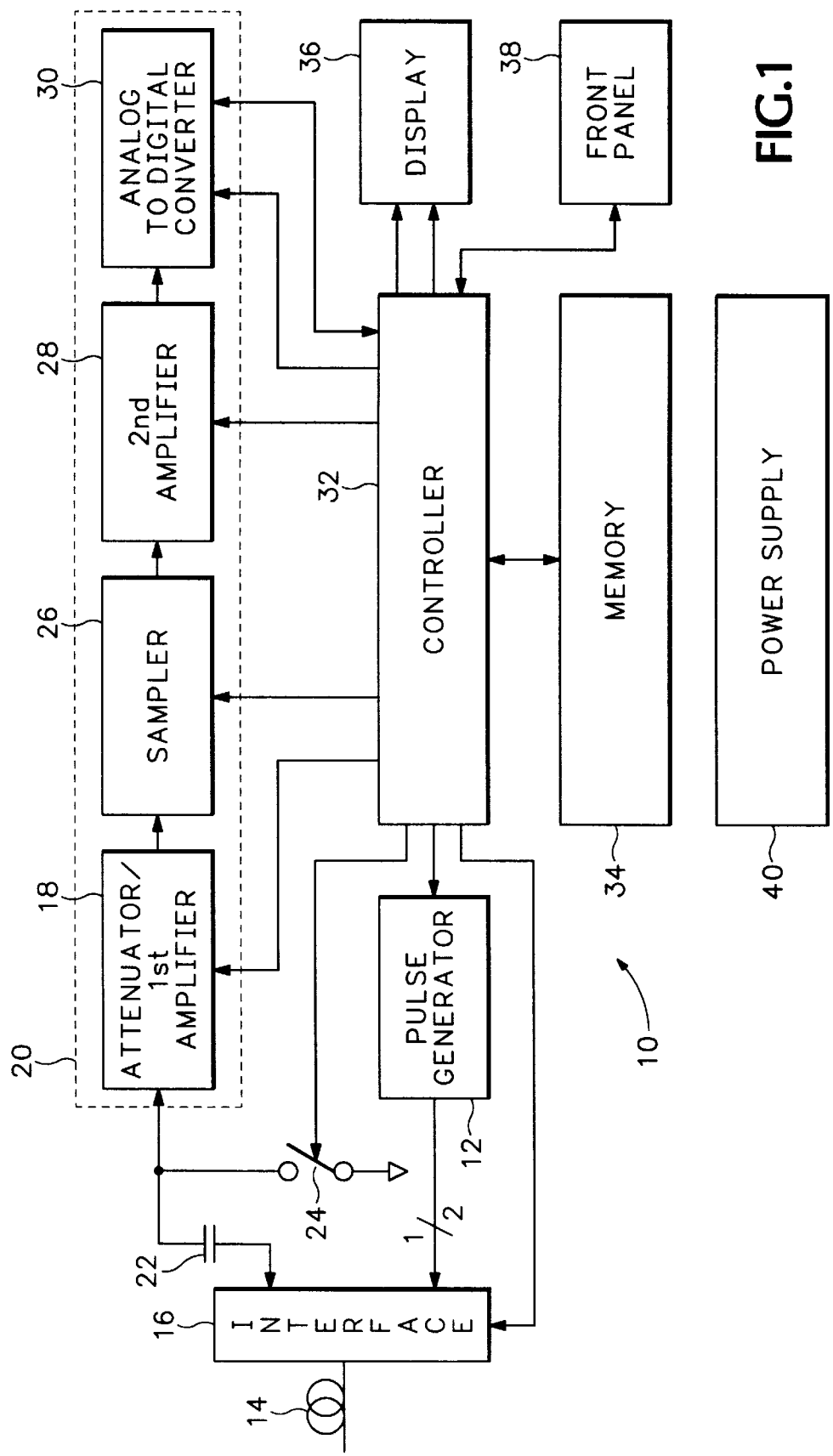
FIG. 1 is a block diagram of an improved time domain reflectometer incorporating a low frequency suppression circuit according to the present invention.

Referring to FIG. 1 there is shown a block diagram of an improved time domain reflectometer (TDR) 10 incorporating the low frequency suppression circuit of the present invention. The TDR 10 includes a pulse generator 12 that produces interrogating energy pulses that are launched into a transmission medium under test 14 via an interface 16. The transmission medium 14 may be shielded or unshielded twisted pairs, coaxial cables, or other types of metallic transmission mediums. The interface 16 may be terminals for connecting each of the twisted pair wires to the TDR 10 or a BNC or other type of coaxial connector for connecting the coaxial cable to the TDR. Return signal energy from events in the cable under test 14 representing flaws, discontinuities, or breaks in the cable is coupled to an attenuator/first amplifier 18 in receiver 20 through capacitor 22. A switch 24 is connected between the capacitor 22 and receiver 20 with one terminal connected to the capacitor 20/receiver junction and the other terminal connected to a voltage reference. The output of the attenuator/first amplifier 18 is coupled to a sampling circuit 26, such as a sample and hold circuit. The sampled analog signal is coupled to a second amplifier 28 for conditioning the sampled signal level to the appropriate level of analog-to-digital converter (ADC) 30. The ADC 30 converts the conditioned analog signal to digital values representative of the magnitude of the analog signal. The digitized values of the sampled analog signal are coupled to controller 32, such as a Motorola 68330 microprocessor, for processing in the digital domain. The controller 32 stores the digital values in memory 34 that includes flash and DRAM. Memory 34 further includes read only memory (ROM) containing programmed control instructions for controlling the acquisition functions of the TDR 10 and processing instructions for the acquired data from the cable under test 14. The controller 32, under program control, generates trigger pulses for the pulse generator 12, controls the operation of switch 24, the attenuation and gain settings of the attenuator/first amplifier 18, the gain of the second amplifier 28, the timing of the sampling circuit 26 and the ADC 30 in relation to the trigger pulses, and the down loading of the ADC 30 digital data. The digital data representing the return signal energy from the cable under test 14 is processed under program control and output to display device 36, such as a cathode-ray-tube, liquid crystal display, or the like. Display processing may be performed by the controller 32 or by a separate display processor (not shown) coupled to receive the processed data from the controller 32. Front panel 38 is coupled to the controller 32 and includes input devices, such as buttons, knobs, soft keys, and the like for initiating examination of the transmission medium and manually setting various TDR 10 parameters, such as the pulsewidth of the interrogating pulses, the instrument gain, sample spacing, measurement range, and the like. Power supply 40 provides operating voltages to the various circuits of the TDR 10.

The commercial embodiment of the improved time domain reflectometer 10 uses Fast-In/Slow-Out (FISO) technology for the acquisition of the return signal energy. FISO technology described in part in U.S. Pat. No. 5,144,525 combines the attenuator/first amplifier 18, the sampler 26 and the ADC 30 into a integrated circuit chip set under overall program control of the controller 32. The second amplifier 28 is not used in the current implementation of the FISO technology.

Referring to FIG. 2A there is shown a waveform representing low frequency interference signals that may be present on twisted pair and coaxial cables requiring suppression using the low frequency suppression circuit of the present invention. The low frequency signals may be considered as any synchronous or non-synchronous signal having a frequency from DC to 120 Hz. The most common type of low frequency signals encountered in TDR applications is induced power line interference that may be a full 120 Volts, 60 Hz, shown as trace 50, or a half-wave rectified power signal, shown as trace 52. A full wave 60 Hz power signal has a repetition time of 16.6 msec and the half wave signal has a repetition time of 8.33 msec.

The time required to acquire data representative of the return reflections in the transmission cable under test 14 is mainly a function of the propagation delay in the cable and the length of the cable. For a typical twisted pair cable the round trip propagation time is approximately 1 meter/nanosec. For a 10,000 ft. cable, this works out to approximately 10 microsec for a typical acquisition. Therefore, the TDR acquisition time is orders of magnitude less than the repetition time of the low frequency interference signals. This is representatively shown by area marked B on the waveform trace. The low frequency suppression circuit of the present invention takes advantage of this relationship to reduce the effects of the interfering signals on the transmission cable while maintaining a wide bandwidth input to the TDR receiver 20.

FIG. 2B is a representative waveform drawing showing the effect of the low frequency suppression circuit on the return reflection signal from a transmission cable under test 14. The waveform shown in FIG. 2B is an expanded view of the waveform at B in FIG. 2A. During periods when the cable 14 is not being tested, switch 24 is closed coupling one side of the capacitor 22 and the input of receiver 20 to a reference voltage. The reference voltage is set to maintain the receiver within the linear range of the ADC 30. In the preferred embodiment of the present invention, the reference voltage is the instrument ground. Alternately, the switch 24 may be coupled to some positive or negative voltage source. With the capacitor 22 coupled to the voltage reference, the capacitor 22 is charging to the level of the low frequency interference signal. Prior to the launching of the interrogating pulse into the cable under test 14 from the pulse generator 12, the controller 32 generates a signal that opens switch 24 as shown in FIG. 2C. This signal is generated approximately 1 microsec before the launching of the interrogating pulse as shown by C in FIG. 2C. The exact timing of the controller 32 signal to switch 24 is a function of the turn-off time of the switch 24 and will vary on the particular switch circuitry design, which will be described in greater detail below. However, it is important that the switch be fully open prior to the launching of the interrogating pulse.

With switch 24 open, capacitor 22 functions as a DC blocking capacitor. Receiver 20 is a high input impedance device having an input impedance in the range of 1 megohms and a capacitance in the range of 18 pF. In the preferred embodiment of the present invention capacitor 22 has a value in the range of 0.01 to 0.1 microfarads for maintaining the charge on the capacitor approximately constant. Capacitor 22 passes the high frequency return reflection signal 54 from the cable under test 14 while blocking low frequency voltage which was on the line when the switch 24 was opened. As previously stated, acquisition time period for a 10,000 ft cable is in the range of 10 microsec as shown at D. The acquisition time period may be less for shorter cables or more for longer cables. During the time period when the switch 24 is open, the low frequency interference signal is coupled to the receiver input as shown by the dashed line 56. The worst case effect of this signal for a 10,000 ft. cable is in the range of 5 mV. Referring back to the high pass filter used in the current state of the art TDRs, it requires a high pass filter having a cut-off frequency in the range of 600 kHz to suppress low frequency interference signals to a 10 mV level. The present invention improves the low frequency interference signal suppression level while substantially lowering the low frequency cutoff of the received input signal.

After the acquisition of the return reflected signal, the controller 32 signal to the switch 24 is removed and the switch 24 closes recoupling the capacitor 22 and the receiver 20 input to voltage reference as shown on the waveforms of FIGS. 2B and 2C at E. The exact timing of the switch 24 closure is not critical but sufficient time should be provided for a stable charge on capacitor 22 prior to the next opening of the switch 24. In the preferred embodiment of the present invention, a 200 microsec delay is provided between the end of one acquisition and the start of the next acquisition. This allows the die-out of echoes in the cable under test 14 and any other synchronous artifacts. Because of the difference in the acquisition time of the TDR 10 and the repetition time of the low frequency interference signal, multiple acquisitions may be made during a single cycle of the low frequency interference signal. Averaging the multiple acquisitions over a single duty cycle of the interference signal reduces and flattens out the charging effect on the capacitor 22. This may be understood by observing in the waveform of FIG. 2A that on average there will be an equal number of acquisitions on the positive going slope of the interference signal as on the negative going slope.

Figure 3:
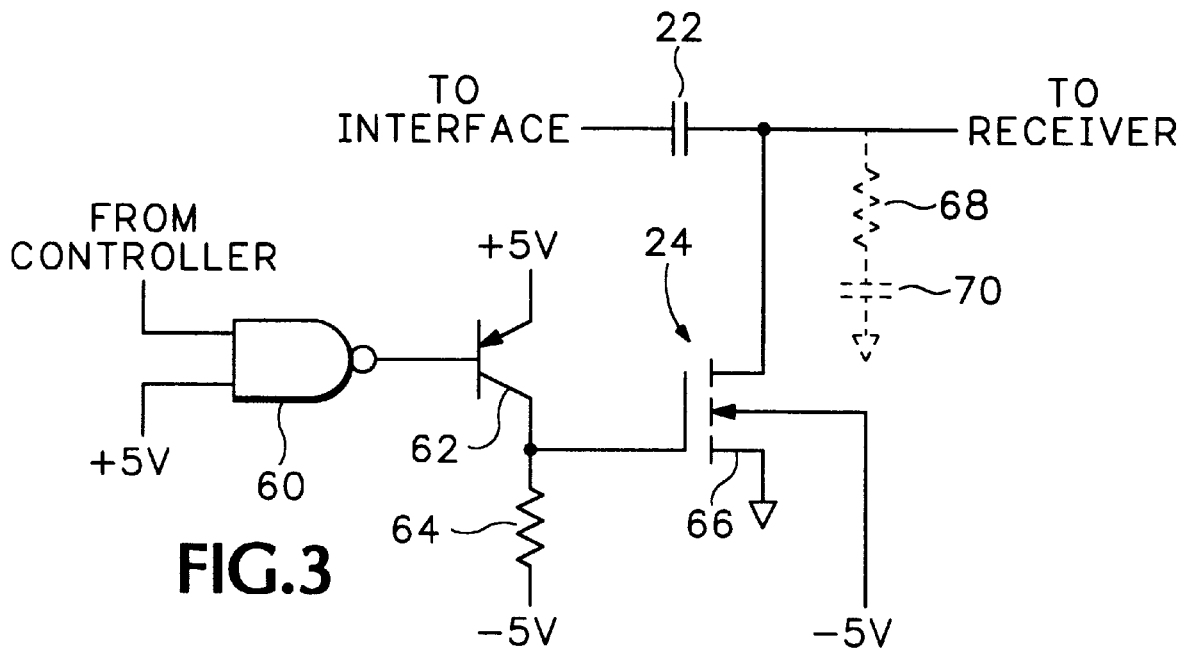
FIG. 3 is a representative schematic drawing of switch drive circuit for an electronic switch in the low frequency suppression circuit in the improved time domain reflectometer according to the present invention.

Referring to FIG. 3, there is shown a representative schematic drawing of the electronic switch circuity for driving switch 24. The circuit includes a NAND gate 60 having one input coupled to receive the switch control signal from controller 32 and the other input coupled to a positive voltage source. The output of NAND gate 60 is coupled to the base of drive transistor 62. The emitter of transistor 62 is coupled to a positive voltage source with the collector coupled through resistor 64 to a negative voltage source. The collector of transistor 62 is coupled to the gate of FET 66 functioning as the electronic switch 24. The source of FET 66 is coupled to the voltage reference, which in the preferred embodiment is the instrument ground. The drain of FET 66 is coupled to capacitor 22 and the input of receiver 20.

During the period when switch 24 is closed, a logical high is output from the controller 32 to the input of NAND gate 60. The output of NAND gate 60 is a logical low voltage that is coupled to the base of transistor 62 causing transistor 62 to conduct and coupling the positive voltage source on the emitter of transistor 62 to the gate of FET 66. The positive voltage on the gate of FET 66 causes the FET 66 to conduct coupling the voltage source on the source of the FET 66 to the capacitor 22 and the receiver 20 input.

The switch 24 is opened by the initiation of a negative going pulse from the controller 32 coupled to the input of NAND gate 60. The output of NAND gate 60 rises to a logical high shutting off transistor 62. The collector of transistor 62 falls to the negative voltage source value, which is coupled to the gate of FET 66. The negative voltage on the gate of FET 66 causes the gate to shut off and decouples the voltage source on the source of the FET 66 from the capacitor 22 and the receiver input. The time required to completely shut-off FET 66 is a function of the value of resistor 64. In the preferred embodiment of the present invention, resistor 64 has a value of 47 kΩ. The improved time domain reflectometer incorporating the low frequency suppression circuit is a battery operated instrument and using a 47 kΩ resistor in the switch 24 drive circuit keeps the quiescent current in the circuit to a minimum thus increasing battery life. A lower value resistor may be used in the circuit with a corresponding battery current and switching speed increase. However, the speed at which the switch opens and closes is not critical to the implementation of the instant invention. The initiation of the switch pulse from the controller 32 may be varied to take into account the turn-on time of the switch 24. It is only necessary that the switch be completely open at the time the interrogating pulse is launched into the cable under test 14.

FIG. 3 further shows a dashed resistance 68 and capacitance 70 that is associated with the FET 66. Ideally, switch 24 should have zero resistance and zero capacitance. However, current low resistance FETs have a large junction which produces a higher capacitance in the off state reducing the input bandwidth of the receiver 20. For example, a twisted pair cable has a characteristic impedance of 105 ohms and the return signal from this cable appears as if it is coming from a signal generator having a 105 ohm output impedance. Loading this with a low resistance switch having a capacitance in hundreds of picofarads effectively produces a low pass filter that filters out the return signal. In the preferred embodiment of the present invention FET 66 is a DMOS device, manufactured and sold by Siliconix, Inc, Annandale, N.J., under part number ST211. FET 66 is characterized as a low resistance, low capacitance device. The junction capacitance of this device is in the range of 2–3 picofarads with a resistance in the range of 7 ohms. Deep channel FETs are being developed that have a lower resistance, in the range of 1–2 ohms, without increasing the capacitance of the FET junction. These types of devices, when available, are preferable in implementing the instant invention.

Figure 4:
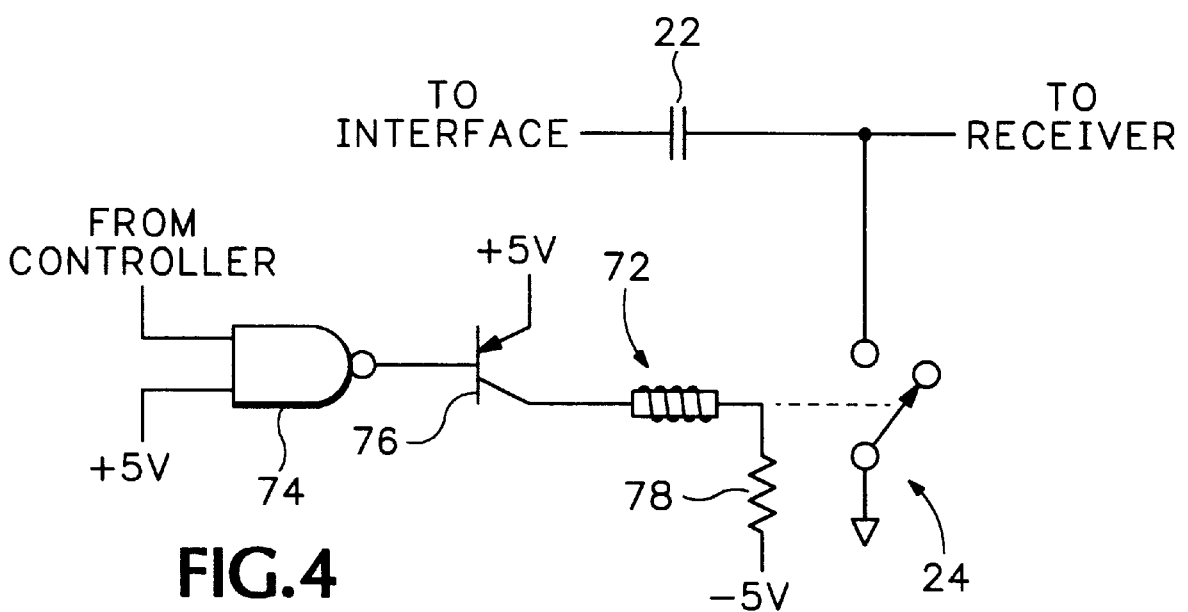
FIG. 4 is a representative schematic drawing of an alternative switch drive circuit for a relay switch in the low frequency suppression circuit in the improved time domain reflectometer according to the present invention.

Referring to FIG. 4, there is shown a schematic diagram of an alternative switch 24 circuit using a relay 72. The circuit includes a NAND gate 74 having one input coupled to receive the switch control signal from controller 32 and the other input coupled to a positive voltage source. The output of NAND gate 74 is coupled to the base of drive transistor 76. The emitter of transistor 76 is coupled to a positive voltage source with the collector coupled through relay 72 coil and resistor 78 to a negative voltage source. One terminal of the relay is the voltage reference, which in the preferred embodiment is the instrument ground while the other pole is coupled to capacitor 22 and the input of receiver 20.

During the period when switch 24 is closed, a logical high is output from the controller 32 to the input of NAND gate 74. The output of NAND gate 74 is a logical low voltage that is coupled to the base of transistor 76 causing transistor 76 to conduct. Current is drawn through the relay 72 coil closing the relay contact and coupling the voltage reference to the capacitor 22 and the receiver 20 input.

Switch 24 is opened by the initiation of a negative going pulse from the controller 32 coupled to the input of NAND gate 74. The output of NAND gate 74 rises to a logical high shutting off transistor 62. The lack of current flow through the relay 72 coil opens the relay contact decoupling the voltage reference from the capacitor 22 and receiver input.

A low frequency suppression circuit for use in a time domain reflectometer has been described having a capacitor connected in series between a transmission cable under test and a receiver input and a switch for selectively disconnecting the capacitor and the receiver input from a voltage source during the launching of interrogating pulses and acquisition of data by the receiver. The value of the capacitor is selected from a range of values consistent with the characteristic impedance of the receiver input for maintaining the charge on the capacitor during the period when the capacitor is disconnected from the voltage reference. The switch may be implemented as an electronic switch using a low resistance and capacitance field effect transistor or a relay. It will be obvious to those having skill in the art that many changes may be made to the details of the above-described embodiments of this invention without departing from the underlying principles thereof The scope of the present invention should, therefore, be determined only by the following claims.

What is claimed is:

1. In a time domain reflectometer having a pulse generator for launching interrogating pulses into a transmission medium under test, a receiver for acquiring data representative of return reflections from the transmission medium, and interface for coupling the pulse generator and receiver to the transmission medium, and a controller for controlling the operation of the time domain reflectometer, an improvement comprising:

a capacitor coupled in series between the interface and the receiver; and a switch having one terminal coupled to a voltage reference and the other terminal coupled between the capacitor and the receiver and responsive to inputs from the controller for selectively disconnecting the capacitor from the voltage reference during the launching of interrogating pulses and acquisition of data by the receiver.

2. The improved time domain reflectometer as recited in claim 1 wherein the receiver is a high input impedance device and the capacitor has a value sufficient for providing a long time constant.

3. The improved time domain reflectometer as recited in claim 1 wherein the capacitor has a value in the range of about 0.01 microfarad to 0.1 microfarad.

4. The improved time domain reflectometer as recited in claim 1 wherein the switch is a field effect transistor having low resistance and capacitance.

5. The improved time domain reflectometer as recited in claim 4 wherein the field effect transistor is a small channel, low capacitance DMOS field effect transistor having a resistance in the range of seven ohms and a capacitance in the range of two to three picofarads.

6. The improved time domain reflectometer as recited in claim 1 wherein the switch is a relay.

7. The improved time domain reflectometer as recited in claim 1 wherein the voltage reference is instrument ground.

\* \* \* \* \*